Aug. 31, 1965 R. C. REDWOOD, JR 3,204,191

TRANSISTOR AMPLIFIER INCLUDING GAIN CONTROL
AND TEMPERATURE SENSITIVE MEANS

Filed Oct. 24, 1962

INVENTOR.
RICHARD C. REDWOOD, JR.

BY Roger W. Jensen
ATTORNEY

United States Patent Office 3,204,191

Patented Aug. 31, 1965

3,204,191

TRANSISTOR AMPLIFIER INCLUDING GAIN CONTROL AND TEMPERATURE SENSITIVE MEANS

Richard C. Redwood, Jr., Los Angeles, Calif., assignor to Honeywell Inc., a corporation of Delaware Filed Oct. 24, 1962, Ser. No. 232,749
6 Claims. (Cl. 330—17)

Figure 1:
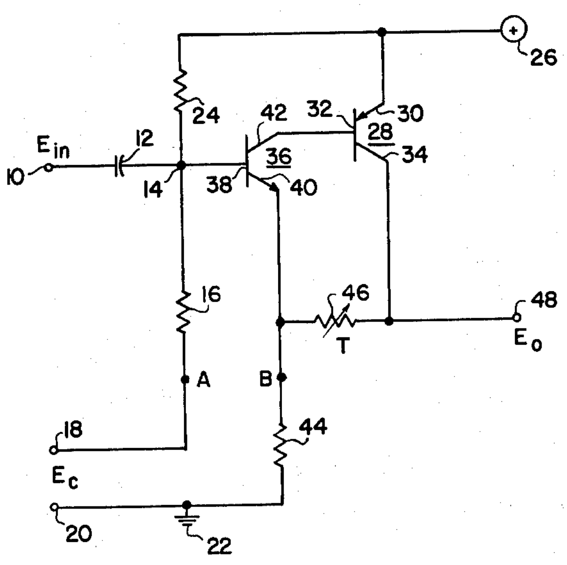

This invention pertains generally to amplifiers and more specifically to an amplifier in which the gain can be changed as a function of a gain control signal.

In the prior art, it is known to utilize an amplifying circuit using a pair of complementary symmetry transistors wherein one resistor or impedance means is connected from a collector of an output transistor to an emitter of an input transistor. A second resistor or impedance means is interposed between the emitter of the input transistor and a ground or reference potential. With this type of circuit, it has been found that the gain of the amplifier is substantially independent of the gain of the two transistors mentioned and is almost entirely dependent upon the ratio of the first and second resistances. This means that the gain of this prior art amplifier can be changed by varying the ratio of the resistances by substitution or by mechanically varying a potentiometer or other device inserted in place of the first resistance to vary the gain of the amplifier. If it be desired that variable gain of the amplifier be obtained, this type of system would require the use of a motor and the associated circuitry to vary the resistance of the potentiometer to vary the gain of the amplifier. This has a great disadvantage of greater cost and complexity.

The present invention in one embodiment constitutes a thermistor or a varistor in place of the first resistor mentioned in the paragraph above. By applying a direct voltage input signal to the input transistor, the voltage across the varistor may be changed to change the resistance thereof and thereby change the ratio of impedances. If a thermistor is used for the first resistance, the heating of the thermistor due to larger current flow therethrough will change its resistance and thereby change the ratio of impedances to change the gain of the amplifier.

Another embodiment of this invention utilizes a transistor for the second impedance means. This transistor constitutes a variable impedance and will vary in impedance according to an input signal. If the transistor is of the normal type and is held in its saturation resistance state, a current signal is required. If the transistor is of a type known as the field effect transistor, linear operation may be obtained using a voltage control signal.

The two embodiments of the present invention provide a large advance over the prior art above mentioned in that a variable gain amplifier is obtained with a minimum of components. The two embodiments also present an advance over other types of variable gain amplifiers many of which attempted to actually change the gain of the transistors or other amplifying devices by changing the bias of these transistors. This means that if the characteristics of the transistor change with age or are changed due to substituting a different transistor in the circuit, the response to the control signal will also be changed. Since the present invention utilizes a circuit in which the gain is independent of the characteristics of the transistor, the response characteristics are much more stable than the prior art variable gain amplifiers.

Accordingly, it is an object of this invention to provide a simplified version of a variable gain amplifier.

Figure 2:
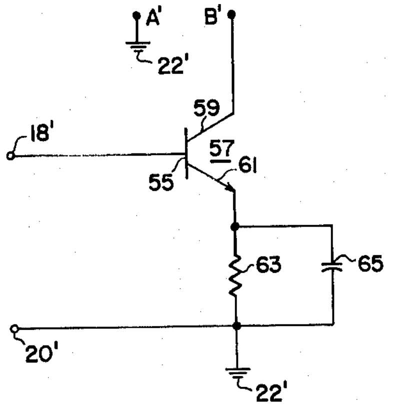

Other objects and advantages of this invention will further become apparent after reading the appended claims and in connection with the specification and the drawings in which:

FIGURE 1 is a circuit diagram of an embodiment of the invention using a thermistor as the variable impedance element; and FIGURE 2 shows the portions which may be substituted in FIGURE 1 wherein a semiconductor may be used as the variable impedance element.

In FIGURE 1, an input terminal 10 is connected to one lead of a capacitive means or impedance element 12 which has its other lead connected to a junction point 14. A resistance element or impedance means 16 is connected between the junction point 14 and a control terminal means 18. A junction point A is situated between terminal means 18 and impedance means 16. Another control terminal means 20 is connected to ground or reference potential 22. Another resistance or impedance means 24 is connected between the junction point 14 and a positive power terminal means 26. A valve means, amplifying means or PNP transistor means 28 including emitter means 30, base means 32, and collector means 34 has its emitter 30 connected to the positive power terminal means 26. A NPN transistor means, amplifying means, or valve means 36 having a base means 38, an emitter means 40, and a collector means 42, has the base means 38 connected to junction point 14. The collector 42 of transistor 36 is connected to the base 32 of transistor 28. A resistance means or impedance means 44 is connected between ground 22 and a junction point B which is further connected to the emitter 40 of transistor 36. The resistance means 46 is connected between the emitter 40 of transistor 36 and collector 34 of transistor 28. The collector 34 is further connected to an output terminal means 48. The resistance means 46 may be a resistance element or impedance element which is very sensitive to temperature changes such as a thermistor. The impedance element 46 may have a high coefficient of resistance change with temperature. In this specification the term "high coefficient of resistance change" means that it is high relative to the change in resistance with temperature that impedance element 44 undergoes. Accordingly, the coefficient of resistance change with temperature for resistance means 44 when described as being low means that it is low in comparison with resistance element 46. However it must be understood that resistance elements 44 and 46 can have opposing characteristics of resistance change with temperature. In this event, increased current will cause one resistance element to increase in resistance as the other decreases in resistance.

In FIGURE 2 terminals shown as A′ and B′ are connected to the terminals A and B in FIGURE 1 and the circuit of FIGURE 2 thereby replaces the resistor 44 and terminals 18 and 20 of FIGURE 1 when this form or embodiment of the invention is used. 18′ is shown as an input terminal and corresponds to previous terminal 18. 18′ is connected to a base 55 of an amplifying means, variable impedance means, valve means or NPN transistor means 57 having a collector 59 and an emitter 61. The collector 59 is connected to terminal B′. The input terminal 20′ which corresponds to the previous terminal 20 is connected to ground 22′. The terminal A′ is also connected to ground 22′. A resistor means or impedance means 63 is connected in parallel with a capacitive means 65 between ground 22′ and emitter 61 of transistor 57.

If terminal 18 and terminal 20 of FIGURE 1 are connected together, it will be found that the gain of this amplifier is substantially equal to the formula $$1+\frac{R_1}{R_2}$$

where resistance $R_1$ is resistance element 46 and $R_2$ is resistance element 44. When the circuit is connected in the assumed condition, it will further be found that the voltage between junction point 14 and ground 22 is substantially that between emitter 40 and ground 22 if the resistance of element 44 is much greater than the input impedance of transistor 36. The normal voltage drop from base to emitter of the transistor of approximately 0.6 volt and therefore the voltage drop from junction point 14 to ground 22 with a large value in resistance element 44 is likely to be very nearly the same as the voltage drop across resistance element 44. This means that in circuit computations the voltage from junction point 14 to ground and the voltage from emitter 40 to ground 22 can be used interchangeably and there will be no appreciable effect on the outcome of the computations. The current through resistance element 44 will then be approximately the voltage from junction point 14 to ground divided by resistance element 44. This will be designated $$\frac{E_c}{R_{44}}$$

Since the current flow through transistor 36 is the bias current for transistor 28, the current flow through resistance element 44 which is obtained from transistor 36 is much smaller than that obtained from transistor 28 and for the present purpose can be disregarded. The current flow through resistance element 46 then for all practical purposes will be $$\frac{E_c}{R_{44}}$$

This means that the voltage obtained at output terminal 48 is $$E_o=\frac{E_c}{R_{44}}(R_{44}+R_{46})$$

If this formula is changed around we come up with the new formula $$\frac{E_o}{E_o}=1+\frac{R_{46}}{R_{44}}$$

It can thus be determined as mentioned before that the gain is proportional to $$\frac{R_{46}}{R_{44}}$$

and is specifically $$1+\frac{R_{46}}{R_{44}}$$

If a direct voltage $E_c$ is applied between terminals 18 and 20 in the circuit as shown in FIGURE 1, the output voltage may be varied while having a constant amplitude input voltage $E_{in}$. The increased current flow through resistance element 46, which is obtained when the voltage $E_c$ is increased, heats the resistance element 46 and thereby lowers its resistance thereby changing the gain of the amplifier between junction point 14 and output terminal 48.

The formula for gain developed above is applicable both to direct voltage gain and to alternating voltage gain. Therefore, the change in direct voltage gain obtained due to the heating of resistance element 46 also affects the alternating voltage gain. The alternating voltage gain is taken between terminal 10 and terminal 48.

If this amplifier is part of a feedback loop, it is possible that the amplifier can be used as shown. If it is necessary that the amplifier provide a given gain for a given input voltage over a wide range of environmental temperatures it may be necessary to enclose both resistance elements 44 and 46 in a constant temperature oven or other constant temperature means to provide good stability for the system.

When the circuit of FIGURE 2 is substituted in the appropriate place in FIGURE 1, the variable impedance is then the transistor 57. The impedance of transistor 57 in series with the parallel combination of the resistor 63 and the capacitor 65 now are deemed the equivalent of resistance 44 in the embodiment shown in FIGURE 1. If transistor 57 is used in the saturated condition, its saturation resistance will vary linearly with the input current applied to terminal 18'. This variation in saturation resistance thereby results in a change of gain in the amplifier between terminals 10 and 48 due to the change in ratio of impedance of resistance 46 to the impedance supplied by the transistor 57. It is also possible that transistor 57 can be used in the unsaturated condition in some circumstances.

It is to be understood that transistor 57, while shown as an NPN transistor may also be a field effect transistor so that the control signal may be a voltage signal rather than a current signal as will be the case if transistor 57 is kept in a saturated condition. It is also to be understood that the capacitance means 65 is not always necessary and has been included to bypass the frequency of the signal being amplified around the resistance means 63. It is further to be understood that in some instances the resistance means 63 will not be needed.

The resistance element 46 of FIGURE 1, if it is desired that this be the variable impedance element, may also be a component such as a varistor which varies only as a function of voltage across it and not as a function of temperature. It might be desirable to use a varistor where the ambient temperature changes over fairly wide extremes. The use of a light bulb in place of resistance means 46 has also been tried and marginally satisfactory results have been obtained. It can therefore be seen that there are many equivalents which can be used in this circuit to obtain the variable gain feature which is the subject matter of this invention.

In describing the preferred embodiments which are illustrated in the drawings, specific terminology has been resorted to for the sake of clarity. However, it is not intended to be limited to the specific terms so selected and it is to be understood that each specific term includes all technical equivalents which operate in a similar manner to accomplish a similar purpose. It is to be further understood that the variable portions of elements 44 and 46 need not necessarily be resistance elements as long as the teaching of this invention is accomplished.

I claim:

1. In variable gain amplifier apparatus comprising, in combination:
   - reference potential means;
   - first and second resistance means;
   - input signal means;
   - NPN transistor means including base, collector and emitter means;
   - PNP transistor means including base, collector and emitter means;
   - capacitive means connected between said input means and said base means of said NPN transistor means;
   - means connecting one end of said first resistance and one end of said second resistance means to said base means of said NPN transistor means;
   - control signal means conected to the other end of said first resistance means;
   - power terminal means connected to the other end of said second resistance means and to said emitter means of said PNP transistor means;
   - output means connected to said collector means of said PNP transistor means;
   - means connecting said collector means of said NPN transistor means to said base means of said PNP transistor means;
   - third resistance means connected between said reference potential means and said emitter means of said NPN transistor means; and
   - temperature sensitive resistance means connected between said emitter means of said NPN transistor means and said output means, said temperature sensitive resistance means changing resistance as a function of a control signal being applied to said control signal means, the control signal changing the bias currents for said transistor means and thereby changing the current through said temperature sensitive resistance means to change the voltage gain from said input means of the amplifier to said output means.

2. In variable gain amplifier apparatus comprising, in combination:

reference potential means;
first and second resistance means;
input signal means;
first transistor means including base, collector and emitter means;
second transistor means including base, collector and emitter means;
means connecting said input means to said base means of said first transistor means;
means connecting one end of said first resistance and one end of said second resistance means to said base means of said first transistor means;
control signal means connected to the other end of said first resistance means;
power terminal means connected to the other end of said second resistance means and to said emitter means of said second transistor means;
output means connected to said collector means of said second transistor means;
means connecting said collector means of said first transistor means to said base means of said second transistor means;
third impedance means connected between said reference potential means and said emitter means of said first transistor means; and
temperature sensitive impedance means connected between said emitter means of said first transistor means and said output means, said temperature sensitive impedance means changing impedance as a function of a control signal being applied to said control signal means, the control signal changing the bias currents for said transistor means and thereby changing the current through said temperature sensitive impedance means to change the voltage gain from said input means of the amplifier to said output means.

3. In variable gain amplifier apparatus comprising, in combination:

reference potential means;
first and second impedance means;
input signal means;
first transistor means including base, collector and emitter means;
second transistor means including base, collector and emitter means;
means connecting said input means to said base means of said first transistor means;
means conecting one end of said first impedance and one end of said second impedance means to said base means of said first transistor means;
control signal means connected to the other end of said first impedance means;
power terminal means connected to the other end of said second impedance means and to said emitter means of said second transistor means;
output means connected to said collector means of said second transistor means;
means connecting said collector means of said first transistor means to said base means of said second transistor means;
third impedance means connected between said reference potential means and said emitter means of said first transistor means; and
fourth impedance means connected between said emitter means of said first transistor means and said output means, said fourth impedance means changing impedance as a function of a control signal being applied to said control signal means, the control signal changing the bias currents for said transistor means and thereby changing the current through said fourth impedance means to change the voltage gain from said input means of the amplifier to said output means.

4. Variable gain apparatus comprising, in combination:

amplifying means including first and second current control means connected to provide first and second stages of amplification and input and output means, said second current control means being connected to said output means;
resistive means connected between said first current control means and said output means, said resistive means comprising a feedback means for keeping the gain of said amplifying means substantially independent of variations in said first and second current control means;
control means for supplying an input gain control signal;
impedance means connected to said first current control means, said impedance means including a semiconductor means; and
means connecting said control means for supplying an input gain control signal to said semiconductor means whereby a gain control signal controls the impedance of said semiconductor means and thereby controls the gain of said amplifying means.

5. Variable gain apparatus comprising, in combination:

amplifying means including first and second current control means connected to provide first and second stages of amplification and input and output means, and said second current control means being connected to said output means;
resistive means connected between said first current control means and said output means, said resistive means comprising a feedback means for keeping the gain of said amplifying means substantially independent of variations in said first and second current control means;
means for supplying an input gain control signal;
variable impedance means connected to said first current control means, said variable impedance means including a transistor means; and
means connecting said means for supplying an input gain control signal to said transistor means for controlling the impedance of said transistor means and thereby controlling the gain of said amplifying means.

6. In variable gain amplifier apparatus comprising, in combination:

potential supplying means;
reference potential means;
first and second current control means each including first output, second output, and control means;
means connecting said potential supplying means to said control means of said first current control means and to said first output means of said second current control means;
means connected to said control means of said first current control means for receiving a signal to be amplified;
means connecting said control means of said second current control means to said first output means of said first current control means;
condition sensitive variable first impedance means connected between said second output means of said first and second current control means, said variable first impedance means varying impedance in response to current therethrough;
second impedance means connected between said second output means of said first current control means and said reference potential means;
means for supplying a gain control signal; and
further means connecting said last named means for supplying a gain control signal to said control means of said first current control means, said gain control signal controlling the current through said variable impedance means and thereby controlling the voltage gain of the amplifier apparatus.

References Cited by the Examiner

UNITED STATES PATENTS

| | | | |
|---|---|---|---|
| 2,915,600 | 12/59 | Starke | 330—25 X |
| 3,082,380 | 3/63 | Herrmann | 330—18 |
| 3,117,287 | 1/64 | Damico | 330—29 X |

OTHER REFERENCES

Hurley: Article, Designing Transistor Circuits . . . Automatic Gain Control, Electronic Equipment, June 1957, pages 22–24.

ROY LAKE, *Primary Examiner*.

NATHAN KAUFMAN, *Examiner*.